(12) United States Patent
Chen

(10) Patent No.: US 6,229,135 B1
(45) Date of Patent: May 8, 2001

(54) OPTOELECTRONIC IC RELAY WITH OBSERVING HOLE

(75) Inventor: Chun-Hsia Chen, Taipei (TW)

(73) Assignee: Cosmo Electronics Corp., Taipei (TW)

( * ) Notice: Subject to any disclaimer, the term of this patent is extended or adjusted under 35 U.S.C. 154(b) by 0 days.

(21) Appl. No.: 09/346,734

(22) Filed: Jul. 2, 1999

(51) Int. Cl.[7] ............................... H01L 31/00; H01J 3/14
(52) U.S. Cl. .......................... 250/214.1; 250/216
(58) Field of Search ................... 250/214.1, 216, 250/551, 208.1, 239; 257/706, 666, 676, 82

(56) References Cited

U.S. PATENT DOCUMENTS

| | | | | |
|---|---|---|---|---|
| 4,412,235 | * | 10/1983 | Bois | 250/238 |
| 4,851,695 | * | 7/1989 | Stein | 257/82 |
| 4,888,625 | * | 12/1989 | Mueller | 257/80 |

* cited by examiner

Primary Examiner—Frank G. Font
Assistant Examiner—Layla Lauchman
(74) Attorney, Agent, or Firm—Bacon & Thomas, PLLC

(57) ABSTRACT

An optoelectrical integrated circuit ("IC") is disclosed. The relay comprises an observing opening on the surface for facilitating the determination whether the relay is normally operated by means of observing the internal elements.

6 Claims, 2 Drawing Sheets

OPTOELECTRONIC IC RELAY WITH OBSERVING HOLE

FIELD OF THE INVENTION

The present invention relates to relays, and more particularly to an optoelectronic IC relay in which an observing opening is provided on the surface of the relay for facilitating the determination whether the relay is normally operated.

BACKGROUND OF THE INVENTION

It is known that the optoelectrical integrated circuit ("IC") relay mainly comprises a optoelectrical conversion element having a light-emitting means and a light-receiving means which are optical coupling in nature. The optoelectrical IC relay is employed to maintain in an insulated state as long as it is not activated by a condition change. In other words, the condition change means that the light-emitting means is activated by an input current signal, and then the current signal is converted into a light signal for transmitting to the light-receiving means for further converting into an electrical signal. By utilizing this conversion, the optoelectrical IC relay can acts as an isolator, or a noise suppressor in a circuit, or as filtering out noise in the load of a circuit.

In the application of as the isolator, the optoelectrical IC relay is widely implemented in an OR gate, a NAND gate, or a NOR gate of a logic circuit.

It is also implemented in a current source circuit for comparing an output voltage with a predetermined threshold voltage for generating a feedback signal to control the output voltage. As such, the output voltage is maintained at a regulated level. Alternatively, it is implemented as a solid state relay.

In the application of as the noise suppressor, the optoelectrical IC relay is driven in a current mode due to its low input impedance. Such that noise with a high impedance may be filtered out.

As the optoelectrical IC relay employed in the junction of a transistor-transistor-logic ("TTL") circuit and a high-noise-interference-logic ("TNIL") circuit activated by different current sources, noise will not adversely affect the TNIL circuit.

As the optoelectrical IC relay employed in the clipping circuit, the response is acceptable and there is no adverse effect on the signal circuit.

As the optoelectrical IC relay employed to filter out noise in the load of a circuit, noise spike generated in the load side will not feedback to the logic circuit side.

Typically, a layer of opaque material insulated material is coated on the surface of the optoelectrical IC relay for preventing an external light from entering into the light-emitting means, and also preventing light emitted by the light-emitting means from transmitting to the external.

One drawback is that a user can not see the internal elements of the relay for determining whether the relay is normally operated. The only method to determine whether the relay is normal is by pulling the relay out of the operating circuit. Then, conduct a test on it by a testing device. It is quite inconvenient.

Thus, it is desirable to provide an improved optoelectrical IC relay construction to overcome the above drawback.

SUMMARY OF THE INVENTION

It is an object of the present invention to provide an optoelectrical IC relay in which an observing opening is provided on the surface of the relay for facilitating the determination whether the relay is normally operated by means of observing the internal elements.

The above and other objects, features and advantages of the present invention will become apparent from the following detailed description taken with the accompanying drawings.

DETAILED DESCRIPTION OF THE PREFERRED EMBODIMENTS

Figure 1:
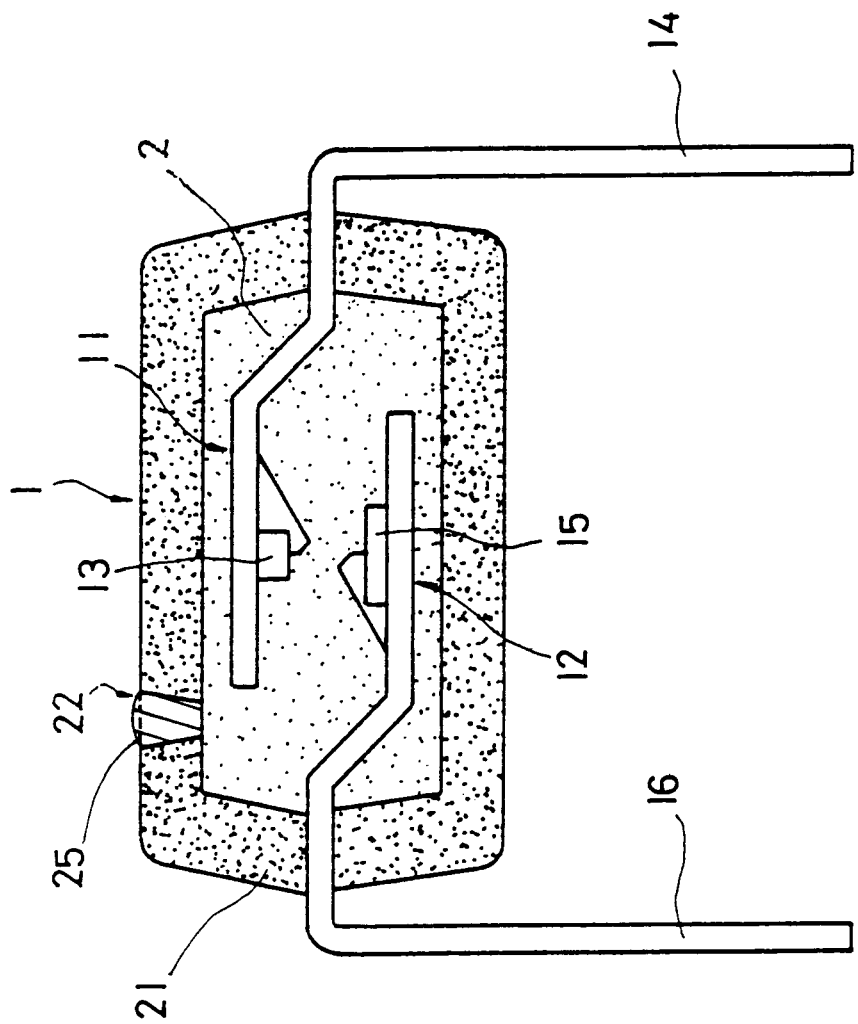
FIG. 1 is a cross-sectional view of an optoelectrical IC relay according to the present invention.

In FIG. 1, an optoelectrical IC relay 1 is shown. The optoelectrical IC relay 1 comprises a light-emitting means 11 having a light-emitting body 13 and a lead 14 extended from one side of the light-emitting means 11, and a light-receiving means 12 having a light-receiving body 15 and a lead 16 extended from one side of the light-receiving means 12. A body of transparent insulated material 2 is wrapped around the light-emitting means 11 and the light-receiving means 12. As such, the light-emitting means 11 and the light-receiving means 12 are not in a conductive communication, while the light emitted by the light-emitting means 11 is received by the light-receiving means 12.

Further, a layer of opaque material 21 is coated on the surface of the body of transparent insulated material 2 for preventing an external light from entering into the relay 1. In addition, as characterized by the invention, a top-to-bottom tapered observing opening 22 is provided on the surface of the opaque material layer 21 for facilitating the determination whether the relay 1 is normally operated by means of observing the light-emitting means 11 and the light-receiving means 12. Further, a transparent plastomer 25 is filled in the observing opening 22 for preventing external dust from entering into the relay 1.

Figure 2:
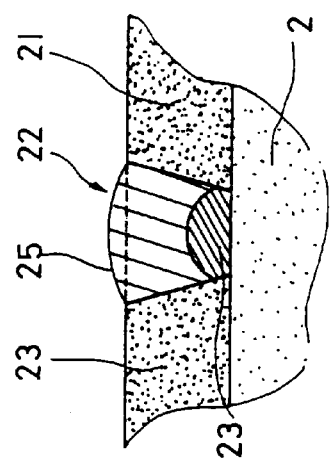
FIG. 2 is a cross-sectional view of a first embodiment according to the present invention.

In the first embodiment of the invention as shown in FIG. 2, a transparent raised round member 23 is provided between the junction surface of the observing opening 22 and the body of transparent insulated material 2. The transparent raised round member 23 acts as refracting and amplifying the light for further facilitating the determination whether the relay 1 is normally operated by means of observing the light-emitting means 11 and the light-receiving means 12.

Figure 3:
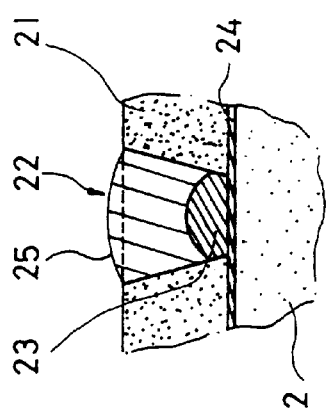
FIG. 3 is a cross-sectional view of a second embodiment according to the present invention.

In the second embodiment of the invention as shown in FIG. 3, a layer of transparent material 24 is provided between the junction of the opaque material layer 21 and the body of transparent insulated material 2 as well as between the junction of the transparent raised round member 23 and the body of transparent insulated material 2.

Figure 4:
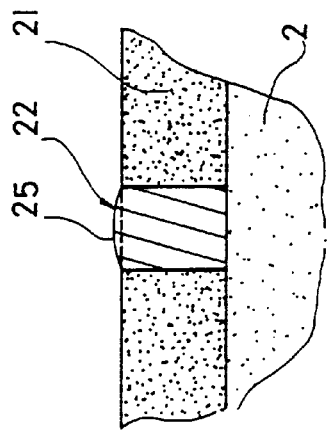
FIG. 4 is a cross-sectional view of a third embodiment according to the present invention.

In the fourth embodiment of the invention as shown in FIG. 4, the observing opening 22 has a rectangular cross-section.

While the invention herein disclosed has been described by means of specific embodiments, numerous modifications and variations could be made thereto by those skilled in the art without departing from the scope of the invention set forth in the claims.

What is claimed is:

1. An optoelectrical IC relay comprising:

a light-emitting means;

a light-receiving means;

a body of transparent insulated material wrapped around the light-emitting means and the light-receiving means for allowing a light emitted by the light-emitting means to be received by the light-receiving means;

a layer of opaque material coated on a surface of the body of transparent insulated material for preventing an external light from entering into the relay; and an observing opening provided between a surface of the layer of opaque material and the body of transparent insulated material for determining whether the relay is normally operated by means of observing the light-emitting means and the light-receiving means.

2. The optoelectrical IC relay of claim 1, further comprising a transparent plastomer provided in the observing opening for preventing an external matter from entering into the relay.

3. The optoelectrical IC relay of claim 1 or 2, further comprising a transparent raised round member provided between a junction of the observing opening and the body of transparent insulated material for refracting and amplifying the light for further determining whether the relay is normally operated by means of observing the light-emitting means and the light-receiving means.

4. The optoelectrical IC relay of claim 3, further comprising a layer of transparent body provided between a junction of the layer of opaque material and the body of transparent insulated material as well as between a junction of the transparent raised round member and the body of transparent insulated material.

5. The optoelectrical IC relay of claim 1, wherein the observing hole has a top-to-bottom tapered shape.

6. The optoelectrical IC relay of claim 1, wherein the observing hole has a rectangular cross-section.

* * * * *